(12) United States Patent
Vorndran

(10) Patent No.: US 11,656,251 B2
(45) Date of Patent: May 23, 2023

(54) RADIATION HARDENED MAGNETIC CURRENT SENSOR

(71) Applicant: Hamilton Sundstrand Corporation, Charlotte, NC (US)

(72) Inventor: John Vorndran, Roscoe, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 16 days.

(21) Appl. No.: 17/307,137

(22) Filed: May 4, 2021

(65) Prior Publication Data

US 2021/0349131 A1 Nov. 11, 2021

Related U.S. Application Data

(60) Provisional application No. 63/021,897, filed on May 8, 2020.

(51) Int. Cl.
*G01R 19/00* (2006.01)
*G01R 15/20* (2006.01)

(52) U.S. Cl.
CPC ....... *G01R 19/0092* (2013.01); *G01R 15/207* (2013.01)

(58) Field of Classification Search
CPC . G01R 19/0092; G01R 15/207; G01R 15/185
See application file for complete search history.

(56) References Cited

U.S. PATENT DOCUMENTS

| | | | |
|---|---|---|---|
| 4,266,190 A | 5/1981 | Lipman | |
| 4,482,862 A * | 11/1984 | Leehey | G01R 19/00 336/212 |
| 4,682,101 A | 7/1987 | Cattaneo | |
| 4,847,554 A | 7/1989 | Goodwin | |
| 5,008,612 A | 4/1991 | Otto | |
| 5,479,095 A | 12/1995 | Michalek et al. | |
| 6,674,278 B1 | 1/2004 | Uesugi | |
| 6,844,799 B2 | 1/2005 | Attarian et al. | |

(Continued)

FOREIGN PATENT DOCUMENTS

| | | |
|---|---|---|
| DE | 4128989 A1 | 3/1993 |
| EP | 0284472 A1 | 9/1988 |
| EP | 0608678 A1 | 2/2020 |

OTHER PUBLICATIONS

EP Search Report; dated Feb. 15, 2022; EP Application No. 21168367. 7; Filed: Apr. 14, 2021; 7 pages.

*Primary Examiner* — Dominic E Hawkins
(74) *Attorney, Agent, or Firm* — Cantor Colburn LLP

(57) ABSTRACT

An integrated magnetic current sensor is provided. Aspects include a first transformer comprising a magnetic core, a first primary winding and a first secondary winding, a voltage source configured to supply a first alternating current (AC) voltage to the first secondary winding, a second transformer comprising, the magnetic core, a second primary winding, a second secondary winding, and a third secondary winding, wherein the first primary winding and the second primary winding are connected in series, and a bi-directional current source configured to bias a magnetic field in the magnetic core by supplying a current to the second secondary winding responsive to a sense current flowing through the first primary winding and the second primary winding.

19 Claims, 1 Drawing Sheet

(56) References Cited

U.S. PATENT DOCUMENTS

| | | |
|---|---|---|
| 6,943,537 B2 | 9/2005 | Blakely |
| 7,321,226 B2 | 1/2008 | Yakymyshyn et al. |
| 7,671,580 B2 | 3/2010 | Hsu |
| 7,834,613 B2 * | 11/2010 | Ziegler ................ G01R 15/185 324/117 R |
| 8,330,402 B2 * | 12/2012 | Ide .......................... H02P 21/18 318/400.01 |
| 9,606,147 B2 | 3/2017 | Epps et al. |
| 2008/0101096 A1 * | 5/2008 | Takayanagi ............... B60L 1/02 363/17 |
| 2009/0108833 A1 * | 4/2009 | Ziegler ................ G01R 15/185 324/117 R |
| 2013/0033351 A1 * | 2/2013 | Kim ........................ H01F 27/38 336/170 |
| 2014/0009143 A1 * | 1/2014 | Blagojevic ............. G01R 33/04 324/244 |
| 2019/0362885 A1 * | 11/2019 | Lu ........................ H01F 27/2823 |
| 2020/0408810 A1 * | 12/2020 | Martel ............... G01R 19/0023 |

* cited by examiner

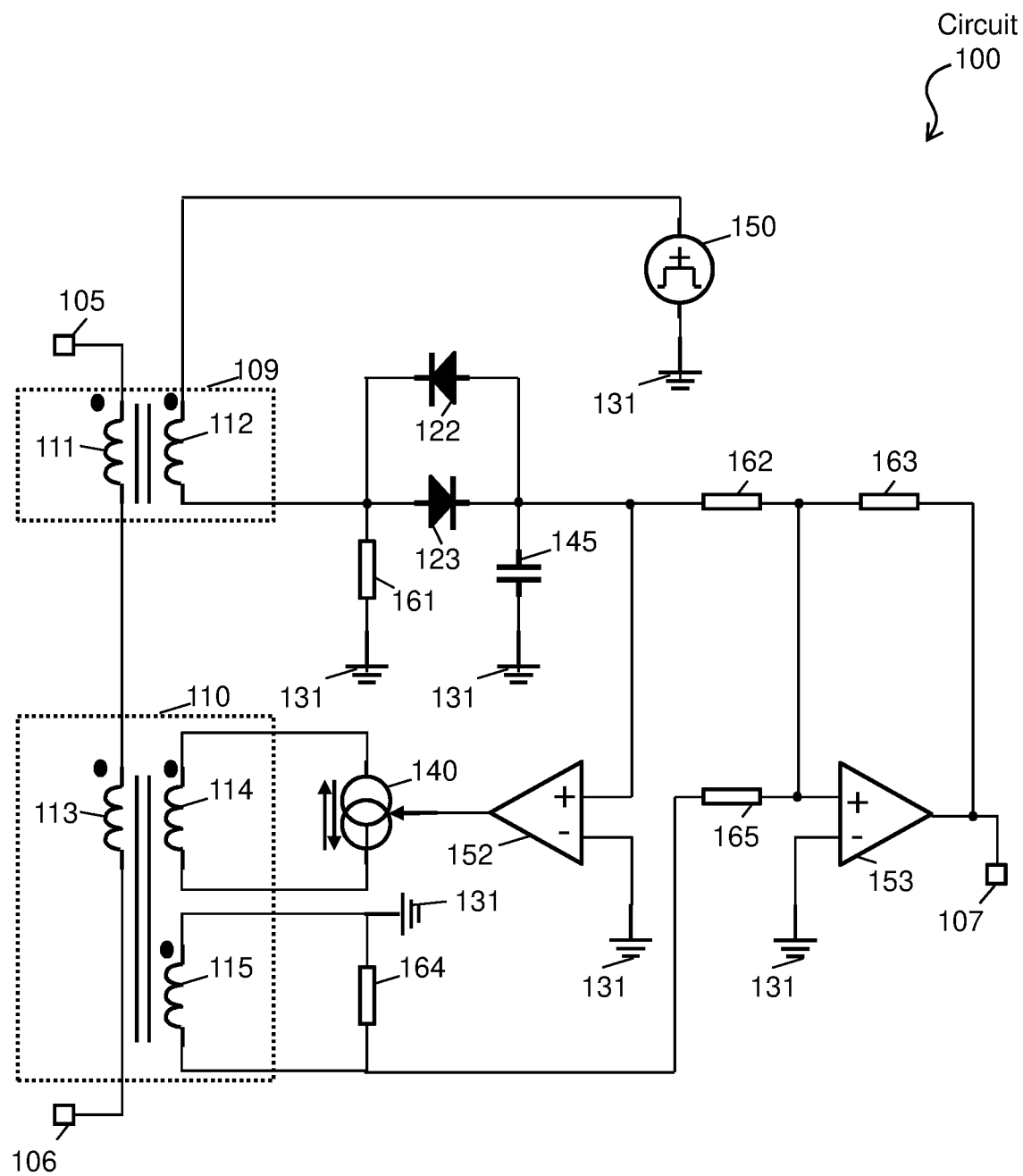

RADIATION HARDENED MAGNETIC CURRENT SENSOR

CROSS-REFERENCE TO RELATED APPLICATIONS

This application claims the benefit of U.S. Application No. 63/021,897 filed May 8, 2020, which is incorporated herein by reference in its entirety.

BACKGROUND

Exemplary embodiments pertain to a radiation hardened magnetic current sensor.

In general, current sensing in high current circuits presents a challenge in space flight applications. For instance, resistors are impractical in high current applications due to size and power dissipation, and Hall Effect sensors require electronics that are sensitive to radiation effects. Thus, a solution for current sensing in a high radiation environment is needed for space applications.

BRIEF DESCRIPTION

According to one or more embodiments, an integrated magnetic sensor is provided. A non-limiting example of the integrated magnetic current sensor included a first transformer comprising a first magnetic core, a first primary winding and a first secondary winding, a voltage source configured to supply a first alternating current (AC) voltage to the first secondary winding, a second transformer comprising, a second magnetic core, a second primary winding, a second secondary winding, and a third secondary winding, wherein the first primary winding and the second primary winding are connected in series, and a bi-directional current source configured to bias a magnetic field in the second magnetic core by supplying a current to the second secondary winding responsive to a sense current flowing through the first primary winding and the second primary winding.

According to one or more embodiments, a system for sensing current is provided. A non-limiting example of the system for sensing current includes a first transformer comprising a first primary winding and a first secondary winding, a second transformer comprising, a second magnetic core, a second primary winding, a second secondary winding, and a third secondary winding, wherein the first primary winding and the second primary winding are connected in series, and a bi-directional current source configured to bias a magnetic field in the second magnetic core by supplying a current to the second secondary winding responsive to a sense current flowing through the first primary winding and the second primary winding, wherein the second primary winding is configured to induce a voltage across the third secondary winding responsive to the sense current flowing through the second primary winding.

BRIEF DESCRIPTION OF THE DRAWINGS

The following descriptions should not be considered limiting in any way. With reference to the accompanying drawings, like elements are numbered alike:

The FIGURE depicts a circuit according to one or more embodiments.

DETAILED DESCRIPTION

A detailed description of one or more embodiments of the disclosed apparatus and method are presented herein by way of exemplification and not limitation with reference to the FIGURES.

Embodiments herein relate to a radiation hardened magnetic current sensor and, more particularly, to a compact integrated magnetic current sensor for current sensing in a high radiation environment, such as space applications. In this regard, embodiments of the compact integrated magnetic current sensor herein provide a wide-band current sensor (e.g., direct current (DC) to ~10 megahertz (MHz) bandwidth) to provide a control system current feedback.

FIG. 1 depicts a wiring diagram of a circuit 100, which is an example of the integrated magnetic current sensor according to one or more embodiments. The circuit 100 can be use in one or more applications, including space applications and applications with respect to surviving a nuclear event. For example, as an astronaut changes between tasks, the astronaut switches power between different devices on a spacecraft to implement a next task (e.g., power is switched to solid state electronic circuitry designed for a next task). As power is switched, a built in current limiting feature is employed to avoid power failures or short circuits. To achieve this, current being provided needs to be sensed. As such, in one embodiment, the circuit 100 is employed to magnetically detect/sense the current when the power switch is engaged.

Also, as another example, the circuit 100 can be used with respect to a thrust vector controller (e.g., a motor drive) that drives three phases of a motor. Because it is desirable to sense the current in all three phases of the motor, the circuit 100 is employed to magnetically detect/sense the current in all three phases of the motor.

In one or more embodiments, the circuit 100 includes an electrical wire network interconnecting electrical components. As shown in FIG. 1, the circuit 100 includes one or more of the following electrical components: terminals 105, 106, and 107; transformers 109 and 110 with primary windings 111, 113, and secondary windings 112, 114, and 115 therein; diodes 122 and 123; a reference or "ground" connection 131 which may be a common location or locations that are connected to common reference potential; a bidirectional current source 140; a capacitor 145; a voltage source 150; operational amplifiers 152 and 153; and resistors 161, 162, 163, 165, and 165. The circuit 100 is configured to detect or sense current over a range of frequencies from DC to several megahertz (MHz).

The circuit 100 is configured to accurately measure electric current over a wide bandwidth (including DC and extending to several megahertz (MHz)). This is achieved utilizing transformers having primary and secondary windings. When utilizing techniques such as keeping the transformer in a state of excitation from an alternating current (AC) power supply, very low frequency components (e.g., DC) flowing in the primary winding of the transformer can be measured in the secondary winding. These transformers also add the benefit of electrical isolation from the circuit being measured. The current to be sensed is supplied via terminals 105, 106 and flows through the primary windings 111, 113 of transformers 109, 110. In one or more embodiments, the current flowing through terminals 105 and 106 can be in any direction (e.g., flowing from 105 to 106 or flowing from 106 to 105). The first transformer 109 is utilized to sense current having both a DC and AC component in a waveform when applied to the terminals 105 and 106. Typically, the DC component cannot be measured by a transformer because a voltage is not induced in the secondary winding of the transformer with a DC current. To account for this, the secondary winding 112 is excited by a voltage source 150 which supplies a constant AC voltage in the form of a square wave across the secondary winding 112 of the first transformer 109 and resistor 161. Resistor 161 can be referred to as a current sense resistor. The voltage supplied from the voltage source 150 is in the form of an AC square wave which provides a positive voltage for the first half of a duty cycle and a negative voltage for the second half of the duty cycle in the range of, for example, +15V to −15V. When a current having both a DC component and an AC current is flowing through terminals 105 and 106, there will a voltage offset field included in the secondary winding 112 and the sense resistor 161 that is caused by the DC current flowing through the primary winding 111. A proportional voltage will be present in the capacitor 145. The voltage waveform across capacitor 145 will be for lower frequencies including DC. That is to say, the DC offset and lower frequencies current will be shown in the capacitor 145. Lower frequency current values include frequency of around 1 kilohertz and lower. In one or more embodiments, as mentioned above, the current flow can be in the "reverse" direction from terminal 106 to 105. In this case, the DC offset will not move the mean amplitude of the square wave voltage supplied from the power supply 150 higher than zero; but, instead will offset the mean amplitude to be lower than zero.

In one or more embodiments, the cross-coupled diodes 122, 123 and capacitor 145 act as a peak rectifier that outputs a DC voltage equal to the peak value of the applied AC signal (e.g., the signal value across resistor 161). This peak voltage value is proportional to the measured low frequency current applied to primary winding 111 and includes a DC offset. This peak voltage value is then applied to an input of a summing amplifier. A summing amplifier is a type of operational amplifier circuit configuration that is used to combine the voltages present on two or more inputs into a single output voltage. The summing amplifier includes resistor 162 and resistor 165 which act as two inputs for operational amplifier (op-amp) 153 and feedback resistor 163. The output of the summing amplifier is a voltage that is proportional to the current flowing through terminals 105 and 106, in either direction. The voltage across resistor 165 is present based on a high frequency current flowing through primary winding 113 inducing a voltage across secondary winding 115. This will be described in greater detail below. The output terminal 107 includes the output voltage of the summing amplifier as described above. This terminal 107 can be connected to a controller or any other device that can be utilized to determine the current flow measured by terminals 105 and 106. The controller determining the current value from terminal 107 can be implemented by executable instructions and/or circuitry such as a processing circuit and memory. The processing circuit can be embodied in any type of central processing unit (CPU), including a microprocessor, a digital signal processor (DSP), a microcontroller, an application specific integrated circuit (ASIC), a field programmable gate array (FPGA), or the like. Also, in embodiments, the memory may include random access memory (RAM), read only memory (ROM), or other electronic, optical, magnetic, or any other computer readable medium onto which is stored data and algorithms as executable instructions in a non-transitory form.

In one or more embodiments, the second transformer 110 with primary winding 113 and secondary winding 115 act as a current transformer that is configured to sense higher frequency (AC) current flowing through the terminals 105 and 106. This higher frequency current is the current sensed over and above the current sensed at secondary winding 112 (greater than around 1 kilohertz). When current flows through primary winding 113, a voltage is induced in secondary winding 115. This voltage is present across resistor 164 and is later summed at the summing amplifier where this voltage across 164 is added to any corresponding voltage across capacitor 145 through the summing resistors 165 and 162.

In one or more embodiments, the first transistor 109 and second transistor 110 can include separate magnetic cores. The magnetic cores can each be made up of a ferrite material, for example. When a current is applied to the terminals 105 and 106, the DC component in the current can saturate the ferrite material used in the magnetic core of the second transformer 110 ultimately corrupting the signal. Once this core is magnetized, it will contain hysteresis and the accuracy will degrade unless the core is demagnetized. In one or more embodiments, to account for the above described issue, the circuit 100 includes a bi-directional current source 140 which is controlled by the output of operational amplifier (op-amp) 152. The positive input of the op-amp 152 is the voltage across capacitor 145 and the negative input is ground 131. A mentioned above, when a DC component of a current flows through primary winding 113, a DC offset field occurs in the magnetic core. This offset field can be counter acted by the bi-directional current source 140 which can supply an equal current through the secondary winding 114 in the opposite direction of the current flowing through primary winding 113. This has the effect of biasing the magnetic field to avoid saturating the magnetic core to allow for operation of the high frequency current detection through primary winding 113 and secondary winding 115. The direction of the current through the secondary winding 114 is controlled by the op-amp 152. When a positive voltage (e.g., positive DC offset) is across 145 when current is flowing from terminal 105 to 106, the bi-directional current source 114 supplies current in the opposite direction. When a negative voltage (e.g., negative DC offset) is at the positive input of op-amp 152, the op-amp controls the bi-directional current source 140 in the opposite direction to counter act the DC offset field in the magnetic core.

In operation, transformers 109 and 110 detect an electric current between the terminals 105 and 106 and generate, with other components of the circuit 100, a signal proportional to that current. This signal can be outputted at terminal 107, as an analog output or a digital output. The signal can include voltage and amperage components. The signal (e.g., the voltage and amperage components) can, in turn, be then used for control purposes, used to display a measured current, and/or stored for further analysis.

In some embodiments, the transformers 109 and 110 utilize a common magnetic core or separate magnetic cores. The magnetic core(s) can be, for example, a low permeability magnetic core enclosed around a current carrying conductor that provides a concentrated magnetic field proportional to the high frequency current through the conductor. In other embodiments, the transformers 109 and 110 utilize magnetic core(s) that are a high permeability magnetic core.

The diodes 122 and 123 are two-terminal electronic components (e.g., a semiconductor diode with a p-n junction connected to two electrical terminals) that have low (e.g., near zero) resistance in one direction, high (e.g., approaching infinite) resistance in the other direction, and conduct current primarily in one direction (e.g., asymmetric conductance).

The grounds 131 can be any electrical ground (e.g., a reference point built into the circuit 100) that is a baseline when measuring other electrical currents. The grounds 131 can be a return path for the circuit 100 and/or allow any spikes in electricity to be directed away from the circuit 100.

The bidirectional current source 140 is an electrical source component that both charges and discharges at once. In an example operation, a current of the bidirectional current source 140 flows primarily in one direction and then in the other. In operation, the current of the bidirectional current source 140 is driven by (can be change with respect to) an output of the operational amplifier 152.

The capacitor 145 is a passive electronic device with two terminals that stores electrical energy in an electric field providing an effect known as capacitance.

The operational amplifiers 152 and 153 (a.k.a. op-amp or opamp) are direct current (DC) coupled high-gain electronic voltage amplifiers with a differential input and a single-ended output. The operational amplifiers 152 and 153 produce an output potential (e.g., relative to the grounds 132 and 133) that is larger than a potential difference between its input terminals (e.g., positive '+' and negative '−' terminals).

The resistors 161, 162, 163, 165, and 165 are a passive two-terminal electrical components that implement electrical resistance to reduce current flow, adjust signal levels, to divide voltages, bias active elements, and/or terminate transmission lines.

The technical effects and benefits of embodiments herein include a method of current sensing without adding an element to the circuit being sensed i.e. resistor etc. That is, the path of the conductor being senses is not broken. technical effects and benefits of embodiments herein also include that the electronics (e.g., components of the circuit 100) associated with the compact integrated magnetic current sensor are available in radiation hardened packages.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An integrated magnetic current sensor comprising:
   a first transformer comprising a first magnetic core, a first primary winding and a first secondary winding;
   a voltage source configured to supply a first alternating current (AC) voltage to the first secondary winding;
   a second transformer comprising, a second magnetic core, a second primary winding, a second secondary winding, and a third secondary winding, wherein the first primary winding and the second primary winding are connected in series;
   a bi-directional current source configured to bias a magnetic field in the second magnetic core by supplying a current to the second secondary winding responsive to a sense current flowing through the first primary winding and the second primary winding; and
   a first operational amplifier configured to operate the bi-directional current source;
   wherein biasing the magnetic field in the second magnetic core comprises operating, by the first operational amplifier, the bi-directional current source to supply the current to the second secondary winding in a direction that is opposite a direction of the sense current flowing through the first primary winding.

2. The integrated magnetic current sensor of claim 1, wherein the second primary winding is configured to induce a voltage across the third secondary winding responsive to the sense current flowing through the second primary winding.

3. The integrated magnetic current sensor of claim 2, further comprising:
   a peak amplifier coupled to the first secondary winding, wherein the peak amplifier is configured to output a DC voltage representing a peak voltage of a second AC voltage across a sense resistor in series with the first secondary winding, and wherein an output of the peak amplifier comprises a control input to the first operational amplifier; and
   a summing amplifier, wherein an input to the summing amplifier comprises the output of the peak amplifier and the voltage induced across the third secondary winding;
   wherein an output of the summing amplifier comprises a voltage value proportional to the sense current flowing through the first primary winding and the second primary winding.

4. The integrated magnetic current sensor of claim 3 further comprising:
   a controller configured to determine a current value of the sense current flowing through the first primary winding and the second primary winding based on the voltage value outputted from the summing amplifier.

5. The integrated magnetic current sensor of claim 3, wherein a positive input to the first operational amplifier comprises an output of the peak amplifier.

6. The integrated magnetic current sensor of claim 3, wherein the summing amplifier comprises a second operational amplifier with positive feedback.

7. The integrated magnetic current sensor of claim 3, wherein the peak amplifier comprises a first diode, a second diode, and a capacitor; and wherein the first diode is cross-coupled with the second diode.

8. The integrated magnetic current sensor of claim 1, wherein the first AC voltage comprises a square wave.

9. The integrated magnetic current sensor of claim 1, wherein the first magnetic core comprises a low permeability magnetic core.

10. The integrated magnetic current sensor of claim 1, wherein the second magnetic core comprises a high permeability magnetic core.

11. A system for sensing current, the system comprising:
a first transformer comprising a first magnetic core, a first primary winding and a first secondary winding;
a second transformer comprising, a second magnetic core, a second primary winding, a second secondary winding, and a third secondary winding, wherein the first primary winding and the second primary winding are connected in series; and
a bi-directional current source configured to bias a magnetic field in the second magnetic core by supplying a current to the second secondary winding responsive to a sense current flowing through the first primary winding and the second primary winding;
wherein the second primary winding is configured to induce a voltage across the third secondary winding responsive to the sense current flowing through the second primary winding.

12. The system of claim 11, further comprising:
a first operational amplifier configured to operate the bi-directional current source;
wherein biasing the magnetic field in the second magnetic core comprises operating, by the first operational amplifier, the bi-directional current source to supply the current to the second secondary winding in a direction that is opposite a direction of the sense current flowing through the first primary winding.

13. The system of claim 12, wherein a positive input to the first operational amplifier comprises an output of a peak amplifier coupled to the first primary winding.

14. The system of claim 11, further comprising:
a voltage source configured to supply an alternating current (AC) voltage to the first secondary winding;
a peak amplifier coupled to the first secondary winding, wherein the peak amplifier is configured to output a DC voltage representing a peak voltage of a second AC voltage across a sense resistor in series with the first secondary winding, and wherein an output of the peak amplifier comprises a control input to the first operational amplifier; and
a summing amplifier, wherein an input to the summing amplifier comprises the output of the peak amplifier and the voltage induced across the third secondary winding;
wherein an output of the summing amplifier comprises a voltage value proportional to the sense current flowing through the first primary winding and the second primary winding.

15. The system of claim 13 further comprising:
a controller configured to determine a current value of the sense current flowing through the first primary winding and the second primary winding based on the voltage value outputted from the summing amplifier.

16. The system of claim 13, wherein the summing amplifier comprises a second operational amplifier with positive feedback.

17. The system of claim 13, wherein the peak amplifier comprises a first diode, a second diode, and a capacitor; and wherein the first diode is cross-coupled with the second diode.

18. The system of claim 11, wherein the magnetic core comprises a low permeability magnetic core.

19. The system of claim 11, wherein the magnetic core comprises a high permeability magnetic core.

* * * * *